(12) United States Patent
Mittal et al.

(10) Patent No.: US 9,461,584 B2
(45) Date of Patent: *Oct. 4, 2016

(54) COMPENSATION CIRCUIT AND INVERTER STAGE FOR OSCILLATOR CIRCUIT

(71) Applicant: STMicroelectronics International N.V., Amsterdam (NL)

(72) Inventors: Gauri Mittal, Ghaziabad (IN); Kallol Chatterjee, Gananagar (IN); Pallavi Muktesh, Gurgaon (IN); Nitin Jain, Ghaziabad (IN); Pradeep Kumar Badrathwal, Greater Noida (IN)

(73) Assignee: STMICROELECTRONICS INTERNATIONAL N.V., Amsterdam (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/576,535

(22) Filed: Dec. 19, 2014

(65) Prior Publication Data

US 2016/0181978 A1 Jun. 23, 2016

(51) Int. Cl.
*H03B 5/36* (2006.01)

(52) U.S. Cl.
CPC .............. *H03B 5/364* (2013.01); *H03B 5/366* (2013.01)

(58) Field of Classification Search
CPC .................................. H03B 5/06; H03B 5/36
USPC ...................................... 331/115, 116 R, 158
See application file for complete search history.

(56) References Cited

U.S. PATENT DOCUMENTS

| | | | |
|---|---|---|---|
| 6,191,662 B1 * | 2/2001 | Volk ........................ | H03K 3/014 327/142 |
| 6,278,338 B1 * | 8/2001 | Jansson .................... | H03L 5/00 331/109 |
| 6,798,301 B1 | 9/2004 | Balan et al. | |
| 7,262,671 B2 | 8/2007 | Maeder | |
| 7,449,972 B2 | 11/2008 | Juang et al. | |
| 7,522,010 B2 * | 4/2009 | Liang ...................... | H03B 5/364 331/176 |
| 7,688,154 B1 | 3/2010 | Fotouhi | |
| 8,643,445 B1 * | 2/2014 | Samala .................. | H03B 5/364 331/116 FE |
| 2009/0278612 A1 * | 11/2009 | Lim ...................... | H03K 3/3545 331/8 |
| 2011/0148533 A1 | 6/2011 | Ramet | |
| 2013/0002365 A1 | 1/2013 | Zoppi et al. | |

OTHER PUBLICATIONS

Vittoz, Eric, et al: "CMOS Analog Integrated Circuits Based on Weak Inversion Operation," IEEE Journal of Solid-State Circuits, vol. SC-12, No. 3, Jun. 1977, pp. 224-231.
Wikipedia, "Pierce Oscillator," http://en.wikipedia.org/wiki/Pierce_oscillator, Nov. 20, 2013 (1 page).

* cited by examiner

*Primary Examiner* — Jeffrey Shin
(74) *Attorney, Agent, or Firm* — Gardere Wynne Sewell LLP

(57) ABSTRACT

A circuit includes an oscillator circuit to receive a bias current and generate an oscillating signal at an output node. A current differencing circuit subtracts a current at the output node from a reference current to generate a first current. In addition, a current mirroring circuit mirrors the first current to generate the bias current. An inverter stage is coupled to the output node, and includes an input branch configured to receive the oscillating signal and generate first and second control signals based upon the oscillating signal. At least one amplifying branch receives the first and second control signals and amplifies the first and second control signals. An output branch receives the amplified first and second control signals and generates an amplified version of the oscillating signal based upon the amplified first and second control signals.

28 Claims, 7 Drawing Sheets

COMPENSATION CIRCUIT AND INVERTER STAGE FOR OSCILLATOR CIRCUIT

FIELD OF THE DISCLOSURE

This disclosure is related to the field of oscillator circuits, and in particular, to the compensation of oscillator circuits.

BACKGROUND

Crystal oscillator circuits use the mechanical resonance of a vibrating crystal of piezoelectric material to create an electrical signal with a precise frequency. This frequency may be used to keep track of time (as in quartz wristwatches), to provide a stable clock signal for digital integrated circuits or systems on a chip, and to stabilize frequencies for radio transmitters and receivers. However, the motional resistance of the crystal, also called the equivalent series resistance, results in undesirable electrical losses.

These crystal oscillator circuits provide a small amplitude output signal. In order to convert this small amplitude output signal to a full swing output signal, an inverter stage may be utilized. A conventional inverter stage used for these purposes employs, among other components, a PMOS transistor and an NMOS coupled in series between a supply and ground and controlled by the input to the inverter stage such that when the input makes a transition, for a certain range of input voltage both the PMOS transistor and the NMOS transistor are undesirably on. When both the PMOS transistor and the NMOS transistor are on simultaneously, current undesirably flows from the supply to ground, which increases the losses of the inverter stage, and thus the circuit using both the crystal oscillator circuit and the inverter stage.

Mobile devices may employ the crystal oscillator circuits described above as well as the inverter stages described above. In mobile devices that operate based on battery power, reducing electrical losses is highly desirable. Consequently, circuits able to compensate such crystal oscillators for losses are desirable, as well as circuits able to compensate such inverter stages for losses.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

An electronic device disclosed herein includes an oscillator circuit having a motional resistance and a negative resistance, and with a crystal coupled to a first transistor. A compensation circuit is coupled to the oscillator circuit and is configured to modulate a bias of the first transistor such that a transconductance of the first transistor increases the negative resistance in the oscillator circuit to compensate for the motional resistance in the oscillator circuit.

Another electronic device disclosed herein includes an oscillator circuit with a crystal coupled to a first transistor. A compensation circuit is coupled to the oscillator circuit and configured to modulate a bias of the first transistor such that a transconductance of the first transistor compensates the oscillator circuit.

A method aspect includes operating an oscillator circuit having a motional resistance and a negative resistance and comprising a crystal coupled to a transistor. The method also includes modulating a bias of the transistor, using a compensation circuit, such that a transconductance of the transistor increases the negative resistance in the oscillator circuit to compensate for the motional resistance.

An inverter stage disclosed herein includes an input branch configured to receive an oscillating signal and to generate first and second control signals based upon the oscillating signal, with the first and second control signals being offset by a threshold voltage. At least one amplifying branch is configured to receive the first and second control signals and to amplify the first and second control signals. An output branch is configured to receive the amplified first and second control signals and to generate an amplified version of the oscillating signal based upon the amplified first and second control signals.

Another electronic device disclosed herein includes an oscillator circuit having a motional resistance and a negative resistance, including a crystal coupled to a first transistor, and configured to generate an oscillating signal. A compensation circuit is coupled to the oscillator circuit and configured to modulate a bias of the first transistor such that a transconductance of the first transistor increases the negative resistance in the oscillator circuit to compensate for the motional resistance. An inverter stage is configured to receive the oscillating signal and to generate an amplified version of the oscillating signal. The inverter stage includes an input branch configured to receive the oscillating signal and to generate first and second control signals based upon the oscillating signal, with the first and second control signals being offset by a threshold voltage so as to prevent a transient current that would otherwise flow through the input branch during transitions of the oscillating signal. At least one amplifying branch is configured to receive the first and second control signals and to amplify the first and second control signals. An output branch is configured to receive the amplified first and second control signals and to generate the amplified version of the oscillating signal based upon the amplified first and second control signals.

Also disclosed herein is a circuit that includes an oscillator circuit configured to receive a bias current and generate an oscillating signal at an output node. A current differencing circuit is configured to subtract a current at the output node from a reference current to generate a first current. A current mirroring circuit is configured to mirror the first current to generate the bias current.

DETAILED DESCRIPTION

Figure 1:
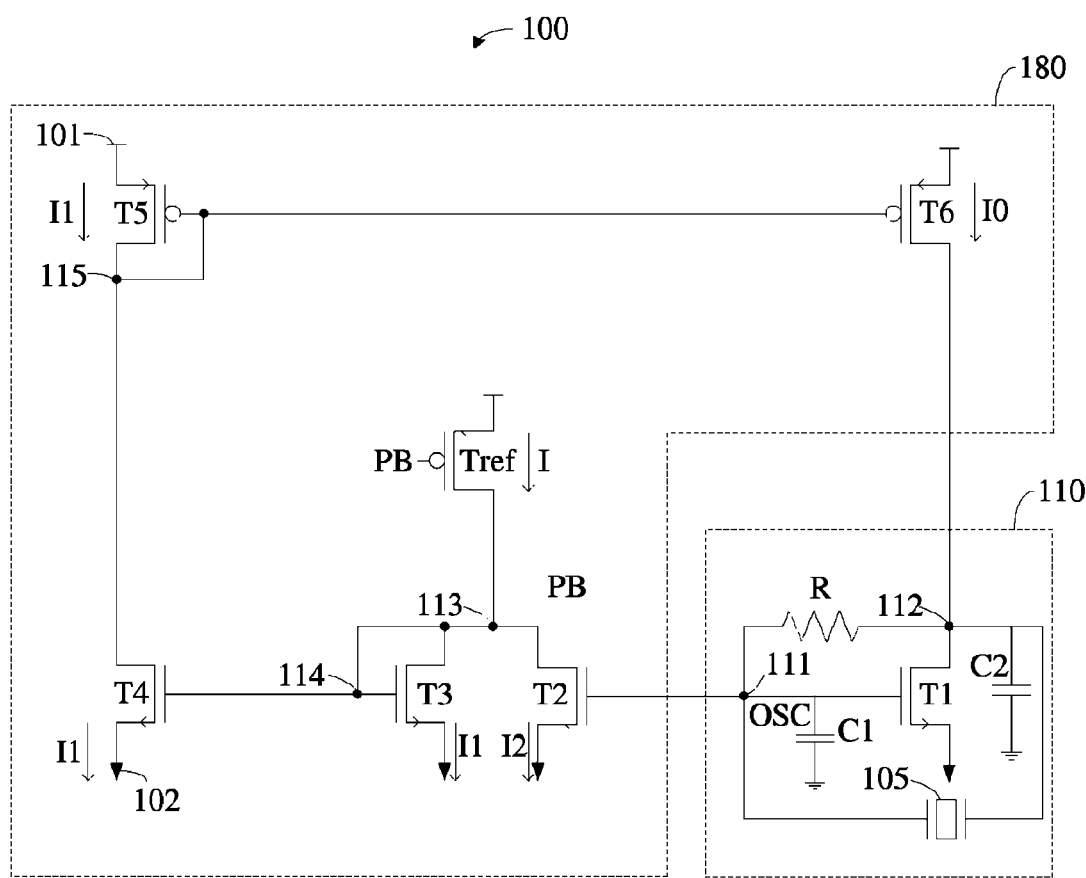
FIG. 1 is a schematic circuit diagram of an electronic device including an oscillator circuit and a compensation circuit.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout, and reference numbers separated by century, as well as reference numbers with prime notation, indicate similar elements in other applications or embodiments.

Referring initially to FIG. 1, an electronic device 100 is now described. The electronic device 100 includes an oscillator circuit 110, illustratively a Pierce oscillator, that generates an oscillating signal. The oscillator circuit 110 includes a first transistor T1 having a gate terminal coupled to a first node, a drain terminal coupled to a second node 112, and a source terminal coupled to a second voltage 102 (such as a ground voltage). A biasing resistor R is coupled in series between the first node 111 and second node 112, and a crystal 105 is likewise coupled in parallel with the resistor R between the first node 111 and second node 112. A capacitor C1 is coupled to the first node 111 for filtering purposes, and a capacitor C2 is coupled to the second node 112 for filtering purposes as well.

The crystal 105 has a motional resistance at its natural resonant frequency (for example, 32 kHz), which is otherwise referred to as its equivalent series resistance. The first transistor T1 has a negative resistance, which increases as the transconductance of the first transistor T1 increases. In order to increase the transconductance of the first transistor T1, so as to increase the negative resistance to help compensate for the motional resistance of the crystal 105, a compensation circuit 180 is coupled to the oscillator circuit 110. This compensation circuit 180 adjusts the transconductance of the first transistor T1 by modulating a bias current I0 flowing through the first transistor T1.

Further details of the compensation circuit 180 will now be provided. A second transistor T2 has a drain terminal coupled to a third node 113, a source terminal coupled to the second voltage 102, and a gate terminal coupled to the first node 111. A third transistor T3 has a drain terminal also coupled to the third node 113, a source terminal also coupled to the second voltage 102, and a gate terminal coupled to a fourth node 114, which is in turn coupled to the third node 113. A reference transistor Tref has a source terminal coupled to a first voltage 101 (such as a positive supply voltage), a drain terminal coupled to the third node 113, and a gate terminal coupled to a current reference node PB.

The transistors Tref, T2, T3 function to create a current subtractor. In greater detail, the current reference node PB biases the reference transistor Tref such that a reference current I flows through the reference transistor Tref and into the third node 113. The second transistor T2 draws a second current I2 which is a mirror of the bias current I0. A first current I1 that represents the difference between the reference current I and the second current I2 flows through the third transistor T3.

A fourth transistor T4 has a drain terminal coupled to a fifth node 115, a source terminal coupled to the second voltage 102, and a gate terminal coupled to the fourth node 114. A fifth transistor T5 has a source terminal coupled to the first voltage 101, a drain terminal coupled to the fifth node 115, and a gate terminal coupled to the fifth node 115. A sixth transistor T6 has a source terminal coupled to the first voltage 101, a drain terminal coupled to the second node 112, and a gate terminal coupled to the fifth node 115. While the current through the third transistor T3 and fourth transistor T4 has been shown as being I1 in FIG. 1, it should be understood that in some embodiments, the current through each of T3 and T4 may be ratioed.

The transistors T4, T5, T6 function to mirror the first current I1 around to the first transistor T1 as the bias current I0. In greater detail, the fourth transistor T4 is in a current mirror relationship with the third transistor T3, and therefore pulls a mirror of the first current I1 from the first voltage 101, through the fifth transistor T5, and through itself. The sixth transistor T6, in turn, is in a current mirror relationship with the fifth transistor T5, and therefore pulls a mirror of the first current through itself as the bias current I0.

The function of the electronic device 100 from startup to a normal operation state is now described. When the electronic device 100 is first powered up, the bias current I0 is at a zero value. Since the first transistor T1 and the second transistor T2 are in a current mirror relationship, the second current I2 is therefore also zero at that point in time. Consequently, due to the current subtractor relationship between Tref, T2, T3, the first current I1 begins to increase. The first current I1 is then mirrored to the fourth transistor T4, which pulls the first current I1 through the fifth transistor T5, which is in a current mirror relationship with the sixth transistor T6. Therefore, the first current I1 is mirrored through the sixth transistor T6. This causes the bias current I0, flowing through the first transistor T1, to increase with the increase in the reference current I. Once the electronic device 100 then reaches its operating state, the values of currents I0, I1, and I2 will be as follows.

$$I1 = \frac{I*N}{P+N}$$

$$I2 = I - I1 = \frac{I*P}{P+N}$$

$$I0 = \frac{I*P*N}{P+N}$$

where, $$\frac{(W/L)_{T6}}{(W/L)_{T5}} = P1, \quad \frac{(W/L)_{T4}}{(W/L)_{T3}} = P2, \text{ and } \frac{(W/L)_{T1}}{(W/L)_{T2}} = N$$

therefore, $$\frac{I0}{I1} = P1*P2 = P, \text{ and } \frac{I0}{I1} = N$$

The output at the first node 111 is an oscillating signal having the frequency of the natural resonant frequency of the crystal 105. This oscillating signal is low in amplitude, and can helpfully be increased in amplitude via an inverter stage, which will be described in detail below.

As has been stated above, the modulation of I0 changes the transconductance of the transistor T1, and therefore increases its negative resistance. This is best shown via the following calculations of the transconductance, in which $$gm = \frac{\Delta I0}{\Delta V0} = \frac{I0*(1+P/N)}{N*VT} = I*\frac{P}{N*VT}$$

where VT is the thermal equivalent of temperature, which is equal to $$\frac{kT}{q}.$$

In conventional circuits, the P/N ratio is 0. In the electronic device 100 described herein, the P/N ratio is 1. Therefore, the effective transconductance is doubled for a given current I0. Thus, the current used to set the transistor T1 of the electronic device 100 described above to have a given transconductance as opposed to the current used to achieve the same transconductance in conventional circuits is lowered by a factor of one half, in turn lowering the power consumption of the electronic device 100 while compensating the oscillator circuit 110. Consequently, the compensation circuit 180 can be said to boost the transconductance of the first transistor T1 by a factor of two.

During transients, if the amplitude of the voltage V0 at the first node 111 is high, the first transistor T1 turns off, and the bias current I0 goes to zero. On the other hand, if the amplitude of the voltage V0 at the first node 111 is low, the current I2 is forced through the third transistor T3, ultimately resulting in an increase in the bias current I0 by a factor of (I2−I1)*P. This means that the greater P is, the greater the transient current in I0 will be.

To cancel out the increase in transient current, the second current I2 can be set to be equal to the first current I1, which would imply that P should equal N. Therefore, to avoid large transients, with the electronic device 100 described above, the boost in transconductance in the first transistor T1 may be limited to a factor of two or less.

Figure 2:
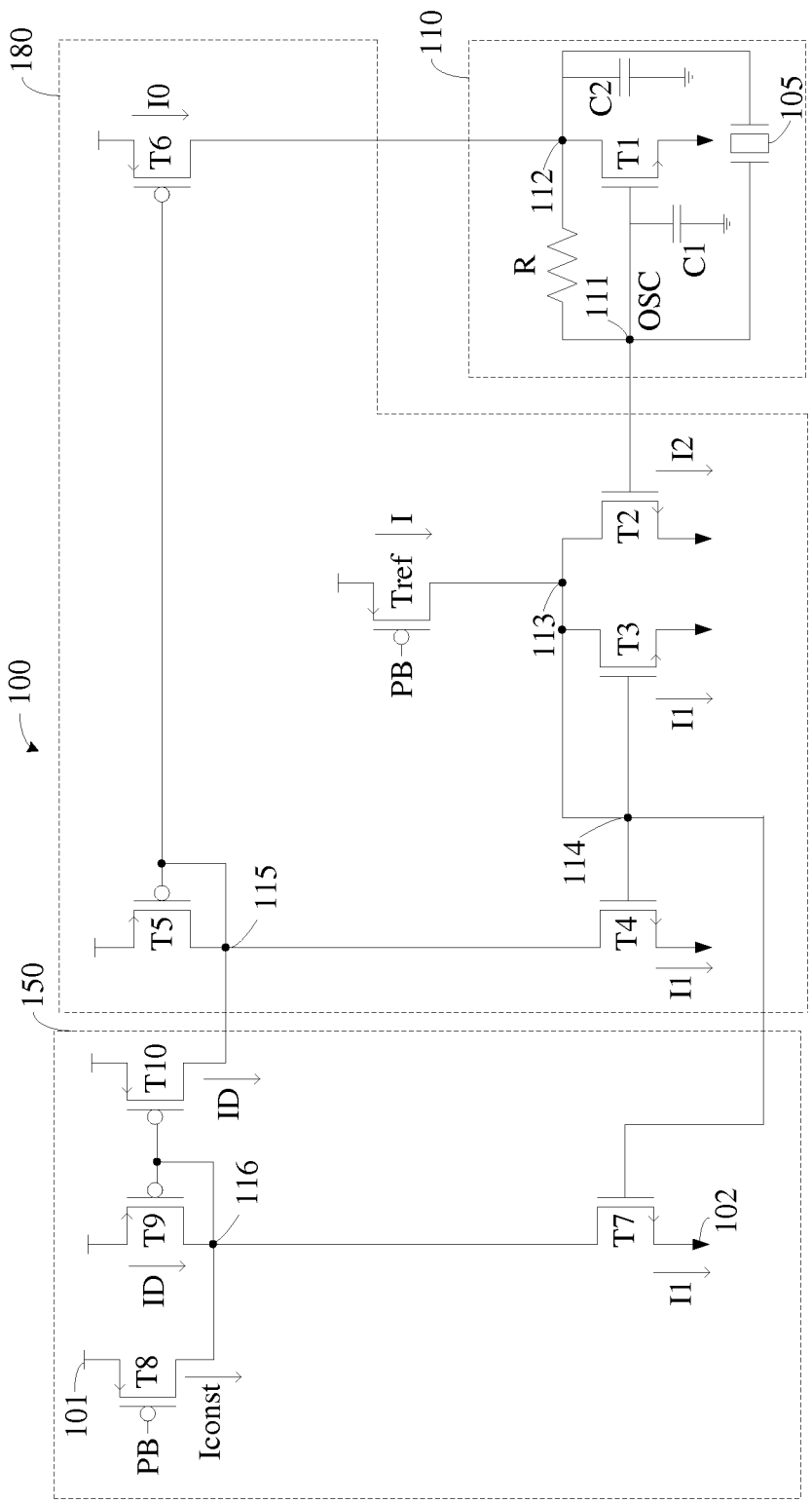
FIG. 2 is a schematic circuit diagram of the electronic device of FIG. 1 including a transient control circuit.

Referring now to FIG. 2, to be able to increase the P/N ratio beyond 1 such that the transconductance of the first transistor T1 can be boosted beyond a factor of two, a transient control circuit 150 can be coupled between the fourth node 114 and the fifth node 115 and configured to limit current flow through the fifth transistor T5 and the sixth transistor T6, thereby limiting the transient current in I0.

The transient control circuit 150 will now be described in detail. A seventh transistor T7 has a drain terminal coupled to a sixth node 116, a source terminal coupled to the second voltage 102, and a gate terminal coupled to the fourth node 114. The seventh transistor T7 is in a current mirror arrangement with the fourth transistor T4 so the first current I1 is mirrored to flow through the seventh transistor T7.

An eighth transistor T8 has a source terminal coupled to the first voltage 101, a drain terminal coupled to the sixth node 116, and a gate terminal coupled to the current reference node PB. Due to the gate terminal of the eighth transistor T8 being coupled to the current reference node PB, a constant current Iconst flows through the eighth transistor T8. A ninth transistor T9 has a source terminal coupled to the first voltage 101, a drain terminal coupled to the sixth node 116, and a gate terminal also coupled to the sixth node 116. A difference current ID representing a difference between the mirror of the first current I1 flowing in the seventh transistor T7 and the constant current Iconst flows through the ninth transistor T9.

A tenth transistor T10 has a source terminal coupled to the first voltage 101, a drain terminal coupled to the fifth node 115, and a gate terminal coupled to the sixth node 116. The tenth transistor T10 is therefore in a current mirror relationship with the ninth transistor T9, thus a mirror of the different current ID flows through the tenth transistor and into the fourth transistor T4. This in turn limits the current flow I1 through the fifth transistor T5, and consequently the current flow I0 through the sixth transistor 16. Limiting the current flow I0 through the sixth transistor 16 limits the current flow through the first transistor T1, thereby isolating it and the current I0 from the transients.

Figure 3:
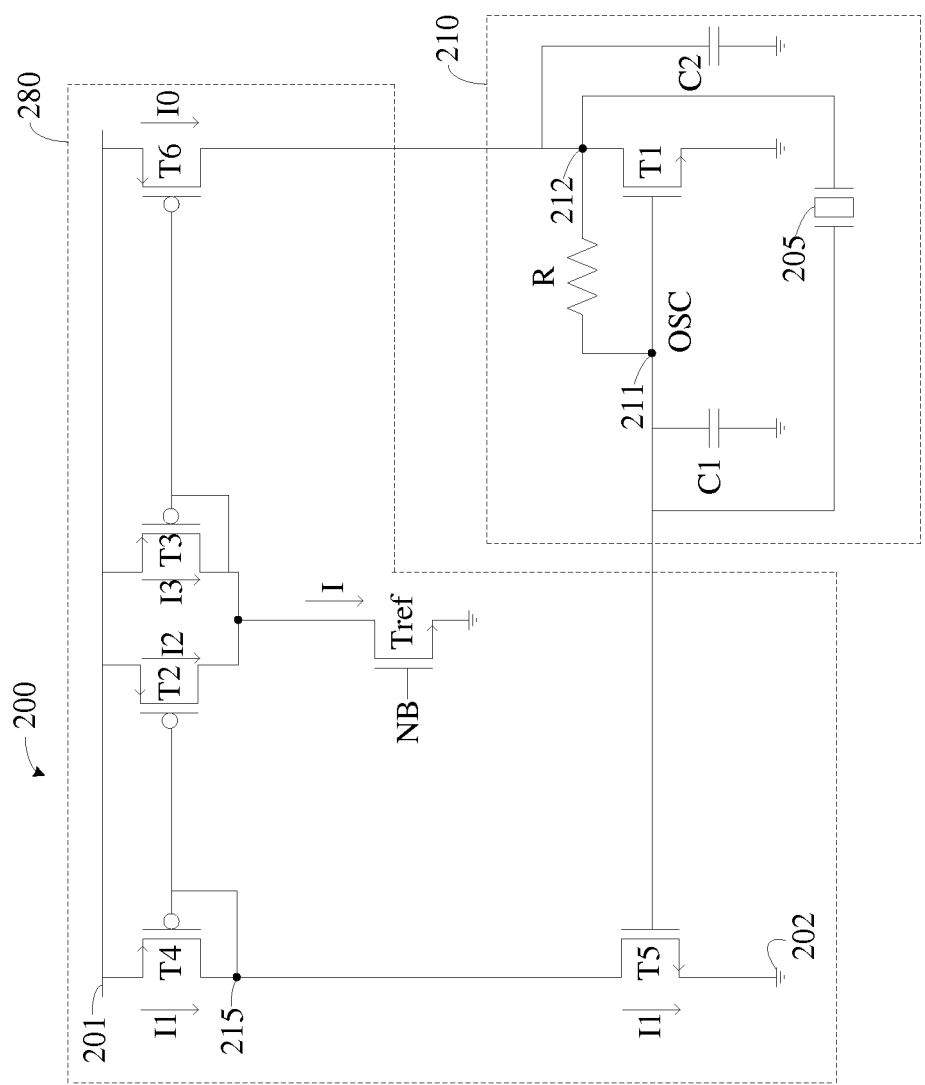
FIG. 3 is a schematic circuit diagram of an alternate embodiment of an electronic device including an oscillator circuit and a compensation circuit.

Although the electronic device 100 has been described above with reference to FIGS. 1 and 2, which utilize a PMOS reference transistor Tref and with the various other transistors selected accordingly, it should be understood that the electronic device 100 could be constructed with a NMOS reference transistor Tref and with the various other transistors also selected accordingly. Such an example is shown in FIG. 3, where the reference transistor Tref is an NMOS transistor, and the second and third transistors T2, T3 are PMOS transistors The functionality of this electronic device 200 is similar to that of the electronic device 100 described above, and the currents and transconductance of the first transistor T1 are ultimately the same as calculated above.

Figure 4:
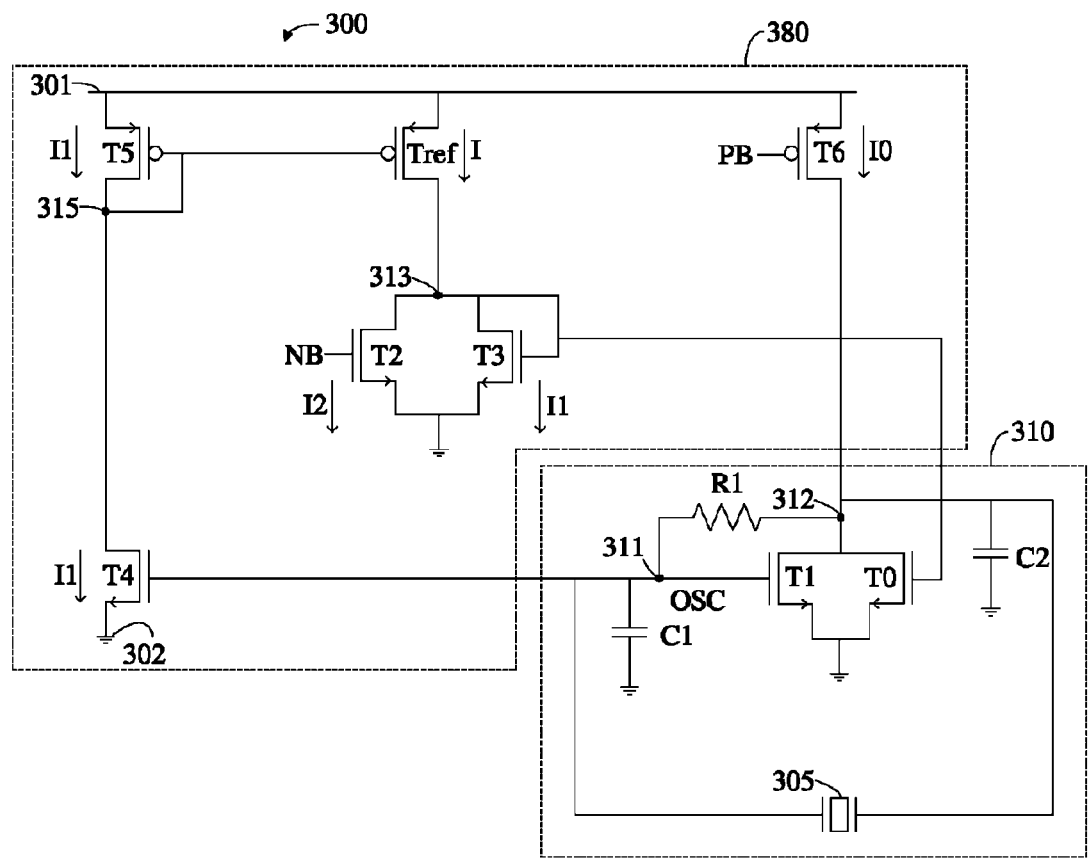
FIG. 4 is a schematic circuit diagram of another alternate embodiment of an electronic device including an oscillator circuit and a compensation circuit.

An alternative configuration is shown in FIG. 4. Here, the oscillator circuit 310 includes an additional transistor T0 and a first transistor T1 having their drain and source terminals coupled together. The source terminals of the additional transistor T0 and first transistor T0 are coupled to ground 302, while the drain terminals of the additional transistor T0 and the first transistor are coupled to a second node 312. The gate terminal of the first transistor T1 is coupled to a first node 311, and a resistor R1 is coupled in series between the first node 311 and second node 312. A crystal 305 is coupled between the first node 311 and second node 312.

The gate terminal of the additional transistor T0 is coupled to the gate terminal of a third transistor T3, which has its source and drain terminals coupled to the source and drain terminals of a second transistor T2. The source terminals of the second transistor T2 and third transistor T3 are coupled to ground 302. The drain terminals of the second transistor T2 and the third transistor T3 at a third node 313. The gate terminal of the second transistor T2 is coupled to the current reference node NB.

A fourth transistor T4 has a gate terminal coupled to the first node 311, a source terminal coupled to ground, and a drain terminal coupled to node 315. A fifth transistor has a source terminal coupled to the first voltage 301, a drain terminal coupled to node 315, and a gate terminal coupled to the gate terminal of a reference transistor Tref. The reference transistor Tref has a source terminal coupled to the first voltage 301 and a drain terminal coupled to the third node 313. A sixth transistor T6 has a source terminal coupled to the first voltage 301, a drain terminal coupled to the second node 312, and a gate terminal coupled to the current reference node PB.

In this structure, transconductance is amplified by the additional transconductance from T0 whose gate has been amplified with respect to 311 using the current mirrors from T1 to T4, then from T5 to Tref, and from T3 to T0.

Figure 5:
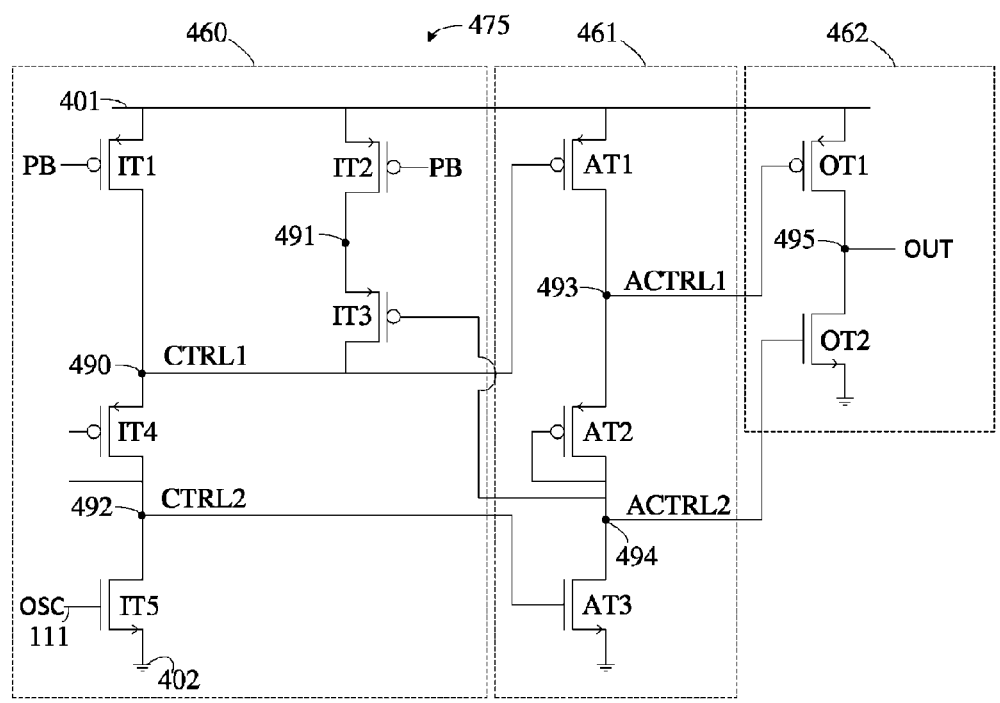
FIG. 5 is a schematic circuit diagram of an inverter stage for use with the electronic devices of FIGS. 1-4.

Referring again to FIG. 1, as stated above, the oscillating signal is output at the first node 111 at a low amplitude. Described herein now with reference to FIG. 5, an inverter stage 475 is used to boost the low amplitude oscillating signal to a full swing oscillating signal. The inverter stage 475 includes an input branch 460 that receives the oscillating signal OSC and generates first and second control signals CTRL1, CTRL2 based upon the oscillating signal. The first and second control signals are offset by a threshold voltage VTH. An amplifying branch 461 of the inverter stage 475 receives the first and second control signals CTRL1, CTRL2 and amplifies the first and second control signals to produce amplified first and second control signals ACTRL1, ACTRL2. An output branch 462 of the inverter stage 475 generates an amplified version of the oscillating signal OUT based upon the amplified first and second control signals ACTRL1, ACTRL2.

Although in the illustrated embodiment, the input branch 460 is shown as a current controlled stage with hysteresis, a push pull circuit (for example by using node 115 from FIG. 1 instead of PB as gate connection for IT1) could be used. In addition, while there is a single amplifying branch 461 shown, it should be understood that any number of amplifying branches may be employed between the input branch 460 and the output branch 462 so as to produce a desired amplified oscillating signal OUT.

In greater detail, the input branch 460 includes a first input branch transistor IT1 having a source terminal coupled to the first voltage 401, a drain terminal coupled to a first input branch node 490, and a gate terminal coupled to the current reference node PB. A second input branch transistor IT2 has a source terminal coupled to the first voltage 401, a drain terminal coupled to a second input branch node 491, and a gate terminal coupled to the current reference node PB.

Figure 6:
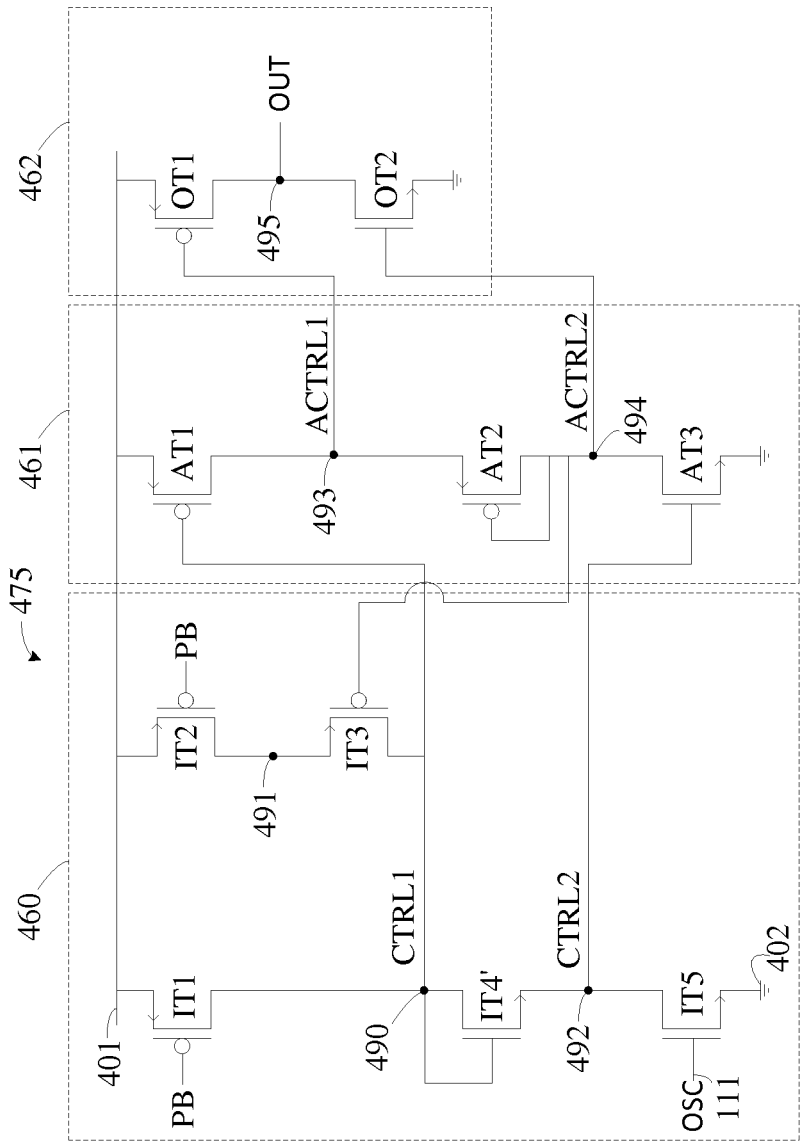
FIG. 6 is an alternative embodiment of the inverter stage of FIG. 5, wherein the PMOS transistor IT4 has been replaced by a NOMS transistor.
Figure 7:
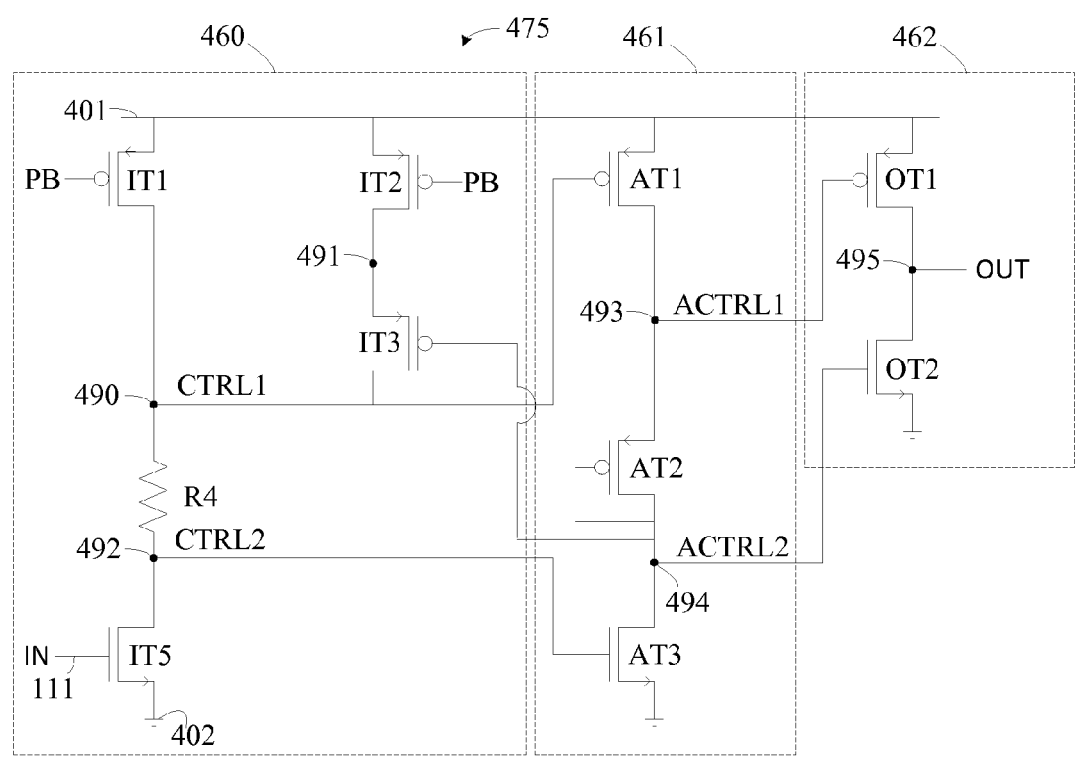
FIG. 7 is an alternative embodiment of the inverter stage of FIG. 5, wherein the PMOS transistor IT4 has been replaced by a resistor.

A third input branch transistor IT3 has a source terminal coupled to the second input branch node 491, a drain terminal coupled to a third input branch node 490, and a gate terminal. A fourth input branch transistor IT4 has a source terminal coupled to the first input branch node 490, a drain terminal coupled to the third input branch node 492, and a gate terminal also coupled to the third input branch node 492. In some cases, the fourth input branch transistor IT4, illustratively a diode coupled PMOS transistor, may instead be a diode coupled NMOS transistor IT4', as shown in FIG. 6. Also, in other cases, the fourth input branch transistor may be replaced by a resistor R4, as shown in FIG. 7.

A fifth input branch transistor IT5 has a drain terminal coupled to the third input branch node 492, a source terminal coupled to a second voltage 402, and a gate terminal configured to receive the oscillating signal OSC. In operation, the first control signal CRTL1 is generated at the first input branch node 490, while the second control signal CTRL2 is generated at the third input branch node 492.

The amplifying branch 461 includes first and second amplifying branch nodes 493 and 494. A first amplifying branch transistor AT1 has a source terminal coupled to the first voltage 401, a drain terminal coupled to the first amplifying branch node 493, and a gate terminal coupled to receive the first control signal CTRL1. A second amplifying branch transistor AT2 has a source terminal coupled to the first amplifying branch node 493, a drain terminal coupled to the second amplifying branch node 494, and a gate terminal also coupled to the second amplifying branch node 494. A third amplifying branch transistor AT3 has a drain terminal coupled to the second amplifying branch node 494, a source terminal coupled to the second voltage 402, and a gate terminal coupled to receive the second control signal CTRL2.

The fourth input branch transistor IT4 is a diode coupled transistor used to create the threshold voltage VTH between the first and second control signals, although in some applications, a large resistor or diode coupled NMOS transistor may be used instead of the fourth input branch transistor IT4. The threshold voltage VTH difference between CTRL1 & CTRL2 helps to ensure that transistors AT1 and AT3 are not on at the same time during transitions. If transistors AT1 and AT3 were to be switched on at the same time, a large current would flow from the first voltage 401 to the second voltage 402, and the power consumption of the inverter stage 475 would be undesirable.

A first output branch transistor OT1 has a source terminal coupled to the first voltage 401, a drain terminal coupled to the output branch node 495, and a gate terminal coupled to receive the amplified first control signal ACTRL1. A second output branch transistor OT1 has a drain terminal coupled to an output branch node 495, a source terminal coupled to the second voltage 402, and a gate terminal coupled to receive the amplified second control signal ACTRL1. The amplified version of the oscillating signal OUT is generated at the output branch node 495.

The control signal CTRL1 controls the first amplifying branch transistor AT1, and the control signal CTRL2 controls the third amplifying branch transistor AT3. The amplified first control signal ACTRL1 is generated at the first amplifying branch node 493, and the amplified second control signal ACTRL2 is generated at the second amplifying branch node 494. ACTRL1 and ACTRL2 are again at an offset of VTH to help ensure that short circuit current does not flow from 401 to 402 through transistors OT1 and OT2.

Although the compensation circuit 180 (FIGS. 1-4) and the inverter stage 475 (FIG. 5) have been described as being used together with the oscillator circuit 110, it should be understood that the compensation circuit and inverter stage may be used separately. That is, the compensation circuit 180 (FIGS. 1-4) may be used with other inverter stages of other designs, and the inverter stage 475 (FIG. 5) may be used with other compensation circuits 180 and oscillator circuits 110 of other designs.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. An electronic device, comprising:
   an oscillator circuit having a motional resistance and a negative resistance, and comprising a crystal coupled to a first transistor; and
   a compensation circuit coupled to the oscillator circuit and configured to modulate a first current of the first transistor such that a transconductance of the first transistor increases the negative resistance in the oscillator circuit to compensate for the motional resistance in the oscillator circuit;
   wherein the compensation circuit comprises:
      a second transistor having a first conduction terminal coupled to a node, a second conduction terminal coupled to a first reference supply voltage, and a control terminal coupled to the first transistor such that a second current flowing through the second transistor mirrors the first current;
      a reference transistor having a first conduction terminal coupled to a second reference supply voltage, a second conduction terminal coupled to said node, and a control terminal coupled to receive a bias voltage that biases the reference transistor to generate a reference current applied to said node; and a third transistor having a first conduction terminal coupled to said node, a second conduction terminal coupled to the second reference supply voltage, and a control terminal for controlling generation of said first current, the third transistor configured to carry a third current representing a difference between the reference current and the second current.

2. The electronic device of claim 1, wherein the first transistor of the oscillator circuit has a first conduction terminal coupled to the compensation circuit, and a second conduction terminal coupled to the second reference supply voltage; and wherein the compensation circuit is configured to modulate the first current flowing from the compensation circuit into the first conduction terminal of the first transistor of the oscillator circuit.

3. The electronic device of claim 1, wherein the oscillator circuit further comprises a first node and a second node; wherein the first transistor of the oscillator circuit has first conduction terminal coupled to the second node, a second conduction terminal coupled to the second reference supply voltage, and a control terminal coupled to the first node.

4. The electronic device of claim 1, wherein the compensation circuit further comprises:
a fourth transistor having a first conduction terminal, a second conduction terminal coupled to the second reference supply voltage, and a control terminal coupled to the control terminal of the third transistor, the fourth transistor configured to mirror said third current;
a fifth transistor having a first conduction terminal coupled to the first reference supply voltage, a second conduction terminal coupled to the fourth transistor, and a control terminal coupled to the fourth transistor, the fifth transistor configured to mirror the current in the fourth transistor; and
a sixth transistor having a first conduction terminal coupled to the first reference supply voltage, a second conduction terminal coupled to the first transistor, and a control terminal coupled to the fifth transistor, the sixth transistor configured to mirror the current in the fifth transistor to generate said first current.

5. The electronic device of claim 4, further comprising a transient control circuit configured to limit current flow through the fifth transistor and the sixth transistor.

6. The electronic device of claim 5, wherein the transient control circuit comprises:
a seventh transistor having a first conduction terminal, a second conduction terminal coupled to the second reference supply voltage, and a control terminal coupled to the control terminal of the third transistor, the seventh transistor configured to mirror said third current;
an eighth transistor having a first conduction terminal coupled to the first reference supply voltage, a second conduction terminal coupled to the seventh transistor, and a control terminal coupled to receive said bias voltage, the eighth transistor configured to generate a constant current;
a ninth transistor having a first conduction terminal coupled to the first reference supply voltage, a second conduction terminal coupled to the seventh transistor, and a control terminal coupled to the seventh transistor, the ninth transistor configured to generate a difference current representing a difference between the mirror of the third current and the constant current;

a tenth transistor having a first conduction terminal coupled to the first reference supply voltage, a second conduction terminal coupled to the fourth transistor, and a control terminal coupled to the ninth transistor, the tenth transistor configured to mirror said difference current for application to the fourth transistor, thereby limiting current flow through the fifth transistor.

7. An electronic device, comprising:
an oscillator circuit comprising first and second nodes, and a crystal coupled to a first transistor having a first conduction terminal coupled to the second node, a second conduction terminal coupled to a second voltage, and a control terminal coupled to the first node; and
a compensation circuit coupled to the oscillator circuit and configured to modulate a bias of the first transistor such that a transconductance of the first transistor compensates the oscillator circuit;
wherein the first conduction terminal of the first transistor is coupled to the compensation circuit to receive a bias current;
wherein the compensation circuit comprises:
a current reference node;
a third node;
a second transistor having a first conduction terminal coupled to the third node, a second conduction terminal coupled to the second voltage, and a control terminal coupled to the first node;
a reference transistor having a first conduction terminal coupled to a first voltage, a second conduction terminal coupled to the third node, and a control terminal coupled to the current reference node; and
a third transistor having a first conduction terminal coupled to the third node, a second conduction terminal coupled to the second voltage, and a control terminal.

8. The electronic device of claim 7, wherein the compensation circuit further comprises:
a fourth node coupled to the control terminal of the third transistor;
a fifth node;
a fourth transistor having a first conduction terminal coupled to the fifth node, a second conduction terminal coupled to the second voltage, and a control terminal coupled to the fourth node;
a fifth transistor having a first conduction terminal coupled to the first voltage, a second conduction terminal coupled to the fifth node, and a control terminal coupled to the fifth node; and
a sixth transistor having a first conduction terminal coupled to the first voltage, a second conduction terminal coupled to the second node, and a control terminal coupled to the fifth node.

9. An inverter stage, comprising:
an input branch configured to receive an oscillating signal and to generate first and second control signals based upon the oscillating signal, the first and second control signals being offset by a threshold voltage;
at least one amplifying branch configured to receive the first and second control signals and to amplify the first and second control signals; and
an output branch configured to receive the amplified first and second control signals and to generate an amplified version of the oscillating signal based upon the amplified first and second control signals.

10. The inverter stage of claim 9, wherein the input branch comprises:
first, second, and third input branch nodes;
a current reference node;
a first input branch transistor having a first conduction terminal coupled to a first voltage, a second conduction terminal coupled to first input branch node, and a control terminal coupled to the current reference node;
a second input branch transistor having a first conduction terminal coupled to the first voltage, a second conduction terminal coupled to the second input branch node, and a control terminal coupled to the current reference node;
a third input branch transistor having a first conduction terminal coupled to the second input branch node, a second conduction terminal coupled to the third input branch node, and a control terminal;
a fourth input branch transistor having a first conduction terminal coupled to the first input branch node, a second conduction terminal coupled to the third input branch node, and a control terminal coupled to the third input branch node; and
a fifth input branch transistor having a first conduction terminal coupled to the third input branch node, a second conduction terminal coupled to a second voltage, and a control terminal configured to receive the oscillating signal;
wherein the first input branch node outputs the first control signal, and the third input branch node outputs the second control signal.

11. The inverter stage of claim 9, wherein the at least one amplifying branch comprises:
first and second amplifying branch nodes;
a first amplifying branch transistor having a first conduction terminal coupled to a first voltage, a second conduction terminal coupled to the first amplifying branch node, and a control terminal coupled to receive the first control signal;
a second amplifying branch transistor having a first conduction terminal coupled to the first amplifying branch node, a second conduction terminal coupled to the second amplifying branch node, and a control terminal coupled to the second amplifying branch node; and
a third amplifying branch transistor having a first conduction terminal coupled to the second amplifying branch node, a second conduction terminal coupled to a second voltage, and a control terminal coupled to receive the second control signal;
wherein the first amplifying branch node outputs the amplified first control signal, and the second amplifying branch node outputs the amplified second control signal.

12. The inverter stage of claim 9, wherein the output branch comprises:
an output branch node;
a first output branch transistor having a first conduction terminal coupled to a first voltage, a second conduction terminal coupled to the output branch node, and a control terminal coupled to receive the amplified first control signal; and
a second output branch transistor having a first conduction terminal coupled to the output branch node, a second conduction terminal coupled to a second voltage, and a control terminal coupled to receive the amplified second control signal;
wherein the output branch node outputs the amplified version of the oscillating signal.

13. An electronic device, comprising:
an oscillator circuit having a motional resistance and a negative resistance, comprising a crystal coupled to a first transistor, and configured to generate an oscillating signal;
a compensation circuit coupled to the oscillator circuit and configured to modulate a bias of the first transistor such that a transconductance of the first transistor increases the negative resistance in the oscillator circuit to compensate for the motional resistance; and
an inverter stage configured to receive the oscillating signal and to generate an amplified version of the oscillating signal, the inverter stage comprising:
an input branch configured to receive the oscillating signal and to generate first and second control signals based upon the oscillating signal, the first and second control signals being offset by a threshold voltage so as to prevent a transient current that would otherwise flow through the input branch during transitions of the oscillating signal,
at least one amplifying branch configured to receive the first and second control signals and to amplify the first and second control signals, and
an output branch configured to receive the amplified first and second control signals and to generate the amplified version of the oscillating signal based upon the amplified first and second control signals.

14. The electronic device of claim 13, wherein the oscillator circuit further comprises a first node and a second node; wherein the first transistor of the oscillator circuit has first conduction terminal coupled to the second node, a second conduction terminal coupled to a second voltage, and a control terminal coupled to the first node.

15. The electronic device of claim 14, wherein the first conduction terminal of the first transistor is coupled to the compensation circuit to receive a bias current; and wherein the compensation circuit comprises:
a current reference node;
a third node;
a second transistor having a first conduction terminal coupled to the third node, a second conduction terminal coupled to the second voltage, and a control terminal coupled to the first node such that a second current flowing through the second transistor mirrors the bias current;
a reference transistor having a first conduction terminal coupled to a first voltage, a second conduction terminal coupled to the third node, and a control terminal coupled to the current reference node, the reference transistor biased such that a reference current flows through the reference transistor and into the third node; and
a third transistor having a first conduction terminal coupled to the third node, a second conduction terminal coupled to the second voltage, and a control terminal, the third transistor biased such that a first current representing a difference between the reference current and the second current flows through the third transistor.

16. The electronic device of claim 15, wherein the compensation circuit further comprises:
a fourth node coupled to the control terminal of the third transistor;
a fifth node;
a fourth transistor having a first conduction terminal coupled to the fifth node, a second conduction terminal coupled to the second voltage, and a control terminal coupled to the fourth node, the fourth transistor biased such that the first current is mirrored to flow through the fourth transistor;

a fifth transistor having a first conduction terminal coupled to the first voltage, a second conduction terminal coupled to the fifth node, and a control terminal coupled to the fifth node, the fifth transistor biased such that the mirror of the first current flows through the fifth transistor; and a sixth transistor having a first conduction terminal coupled to the first voltage, a second conduction terminal coupled to the second node, and a control terminal coupled to the fifth node, the sixth transistor biased such that the mirror of the first current flows through the sixth transistor as the bias current.

17. The electronic device of claim 16, further comprising a transient control circuit coupled between the fourth node and the fifth node and configured to limit current flow through the fifth transistor and the sixth transistor.

18. The electronic device of claim 17, wherein the transient control circuit comprises:

a sixth node;

a seventh transistor having a first conduction terminal coupled to the sixth node, a second conduction terminal coupled to the second voltage, and a control terminal coupled to the fourth node, the seventh transistor biased such that the first current is mirrored to flow through the seventh transistor;

an eighth transistor having a first conduction terminal coupled to the first voltage, a second conduction terminal coupled to the sixth node, and a control terminal coupled to the current reference node, the eighth transistor being biased such that a constant current flows through the eighth transistor;

a ninth transistor having a first conduction terminal coupled to the first voltage, a second conduction terminal coupled to the sixth node, and a control terminal coupled to the sixth node, the ninth transistor being biased such that a difference current representing a difference between the mirror of the first current and the constant current flows through the ninth transistor; and a tenth transistor having a first conduction terminal coupled to the first voltage, a second conduction terminal coupled to the fifth node, and a control terminal coupled to the sixth node, the tenth transistor being biased such that a mirror of the difference current flows through the ninth transistor, thereby limiting current flow through the fifth transistor and in turn limiting current flow through the sixth transistor.

19. The electronic device of claim 15, wherein the input branch comprises:

a current reference node;

first, second, and third input branch nodes;

a first input branch transistor having a first conduction terminal coupled to a first voltage, a second conduction terminal coupled to first input branch node, and a control terminal coupled to the current reference node;

a second input branch transistor having a first conduction terminal coupled to the first voltage, a second conduction terminal coupled to the second input branch node, and a control terminal coupled to the current reference node;

a third input branch transistor having a first conduction terminal coupled to the second input branch node, a second conduction terminal coupled to the third input branch node, and a control terminal;

a fourth input branch transistor having a first conduction terminal coupled to the first input branch node, a second conduction terminal coupled to the third input branch node, and a control terminal coupled to the third input branch node; and a fifth input branch transistor having a first conduction terminal coupled to the third input branch node, a second conduction terminal coupled to a second voltage, and a control terminal configured to receive the oscillating signal;

wherein the first input branch node outputs the first control signal, and the third input branch node outputs the second control signal.

20. The electronic device of claim 15, wherein the at least one amplifying branch comprises:

first and second amplifying branch nodes;

a first amplifying branch transistor having a first conduction terminal coupled to a first voltage, a second conduction terminal coupled to the first amplifying branch node, and a control terminal coupled to receive the first control signal;

a second amplifying branch transistor having a first conduction terminal coupled to the first amplifying branch node, a second conduction terminal coupled to the second amplifying branch node, and a control terminal coupled to the second amplifying branch node; and a third amplifying branch transistor having a first conduction terminal coupled to the second amplifying branch node, a second conduction terminal coupled to a second voltage, and a control terminal coupled to receive the second control signal;

wherein the first amplifying branch node outputs the amplified first control signal, and the second amplifying branch node outputs the amplified second control signal.

21. The electronic device of claim 15, wherein the output branch comprises:

an output branch node;

a first output branch transistor having a first conduction terminal coupled to a first voltage, a second conduction terminal coupled to the output branch node, and a control terminal coupled to receive the amplified first control signal; and a second output branch transistor having a first conduction terminal coupled to the output branch node, a second conduction terminal coupled to a second voltage, and a control terminal coupled to receive the amplified second control signal;

wherein the output branch node outputs the amplified version of the oscillating signal.

22. A circuit, comprising:

an oscillator circuit configured to receive a bias current and generate an oscillating signal at an output node;

a current differencing circuit configured to subtract a current at the output node from a reference current to generate a first current; and a current mirroring circuit configured to mirror the first current to generate the bias current;

further comprising an inverter stage coupled to the output node and comprising:

an input branch configured to receive the oscillating signal and to generate first and second control signals based upon the oscillating signal, the first and second control signals being offset by a threshold voltage;

at least one amplifying branch configured to receive the first and second control signals and to amplify the first and second control signals; and an output branch configured to receive the amplified first and second control signals and to generate an amplified version of the oscillating signal based upon the amplified first and second control signals.

23. The circuit of claim 22, wherein the current mirroring circuit comprises:
a first current mirror circuit to mirror the first current to a second current, and a second current mirroring circuit to mirror the second current to the bias current.

24. The circuit of claim 23, wherein the first mirror circuit further generates a third current; further comprising an additional current differencing circuit configured to subtract the third current from a constant current to generate a fourth current.

25. The circuit of claim 24, wherein the second current mirror circuit includes a differencing circuit configured to subtract the fourth current from the second current to generate the bias current.

26. The circuit of claim 22, wherein the input branch comprises:
first, second, and third input branch nodes;
a current reference node;
a first input branch transistor having a first conduction terminal coupled to a first voltage, a second conduction terminal coupled to first input branch node, and a control terminal coupled to the current reference node;
a second input branch transistor having a first conduction terminal coupled to the first voltage, a second conduction terminal coupled to the second input branch node, and a control terminal coupled to the current reference node;
a third input branch transistor having a first conduction terminal coupled to the second input branch node, a second conduction terminal coupled to the third input branch node, and a control terminal;
a fourth input branch transistor having a first conduction terminal coupled to the first input branch node, a second conduction terminal coupled to the third input branch node, and a control terminal coupled to the third input branch node; and
a fifth input branch transistor having a first conduction terminal coupled to the third input branch node, a second conduction terminal coupled to a second voltage, and a control terminal configured to receive the oscillating signal;
wherein the first input branch node outputs the first control signal, and the third input branch node outputs the second control signal.

27. The circuit of claim 22, wherein the at least one amplifying branch comprises:
first and second amplifying branch nodes;
a first amplifying branch transistor having a first conduction terminal coupled to a first voltage, a second conduction terminal coupled to the first amplifying branch node, and a control terminal coupled to receive the first control signal;
a second amplifying branch transistor having a first conduction terminal coupled to the first amplifying branch node, a second conduction terminal coupled to the second amplifying branch node, and a control terminal coupled to the second amplifying branch node; and
a third amplifying branch transistor having a first conduction terminal coupled to the second amplifying branch node, a second conduction terminal coupled to a second voltage, and a control terminal coupled to receive the second control signal;
wherein the first amplifying branch node outputs the amplified first control signal, and the second amplifying branch node outputs the amplified second control signal.

28. The circuit of claim 22, wherein the output branch comprises:
an output branch node;
a first output branch transistor having a first conduction terminal coupled to a first voltage, a second conduction terminal coupled to the output branch node, and a control terminal coupled to receive the amplified first control signal; and
a second output branch transistor having a first conduction terminal coupled to the output branch node, a second conduction terminal coupled to a second voltage, and a control terminal coupled to receive the amplified second control signal;
wherein the output branch node outputs the amplified version of the oscillating signal.

\* \* \* \* \*